(12) United States Patent
Hawryluk et al.

(10) Patent No.: US 6,479,821 B1
(45) Date of Patent: Nov. 12, 2002

(54) THERMALLY INDUCED PHASE SWITCH FOR LASER THERMAL PROCESSING

(75) Inventors: Andrew M. Hawryluk, Los Altos Hills, CA (US); Somit Talwar, Palo Alto, CA (US); Yun Wang, San Jose, CA (US); David A. Markle, Saratoga, CA (US); Michael O. Thompson, Ithaca, NY (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/659,094

(22) Filed: Sep. 11, 2000

(51) Int. Cl.[7] .......................... G03G 5/16; H01L 21/245
(52) U.S. Cl. ..................... 250/316.1; 438/530
(58) Field of Search .................. 250/316.1; 438/530, 438/199, 535, 533, 655

(56) References Cited

U.S. PATENT DOCUMENTS

| | | | |
|---|---|---|---|
| 5,908,307 A | 6/1999 | Talwar et al. | 438/199 |
| 6,274,488 B1 * | 8/2001 | Talwar et al. | 438/655 |
| 6,303,476 B1 * | 9/2001 | Hawryluk et al. | 438/530 |

* cited by examiner

Primary Examiner—John R. Lee
Assistant Examiner—Johnnie L Smith, II
(74) Attorney, Agent, or Firm—Allston L. Jones

(57) ABSTRACT

A method, apparatus and system for controlling the amount of heat transferred to a process region (30) of a workpiece (W) from exposure with a pulse of radiation (10), which may be in the form of a scanning beam (B), using a thermally induced phase switch layer (60). The apparatus of the invention is a film stack (6) having an absorber layer (50) deposited atop the workpiece, such as a silicon wafer. A portion of the absorber layer covers the process region. The absorber layer absorbs radiation and converts the absorbed radiation into heat. The phase switch layer is deposited above or below the absorber layer. The phase switch layer may comprise one or more thin film layers, and may include a thermal insulator layer and a phase transition layer. Because they are in close proximity, the portion of the phase switch layer covering the process region has a temperature that is close to the temperature of the process region. The phase of the phase switch layer changes from a first phase (e.g., solid) to a second phase (e.g., liquid or vapor) at a phase transition temperature ($T_P$). During this phase change, the phase switch layer absorbs heat but does not significantly change temperature. This limits the temperature of the absorber layer and the process region since both are close to the phase change layer.

48 Claims, 5 Drawing Sheets

THERMALLY INDUCED PHASE SWITCH FOR LASER THERMAL PROCESSING

FIELD OF THE INVENTION

The present invention relates to laser thermal processing, and in particular to a method of and apparatus for precisely controlling the maximum temperature of a workpiece to be processed using a short pulse of radiant energy.

BACKGROUND OF THE INVENTION

Laser thermal processing (LTP) is used to process workpieces such as semiconductor wafers in the manufacturing of semiconductor devices. Such processing allows for the fabrication of transistors with very low sheet resistance and ultra-shallow junctions, which results in a semiconductor device (e.g., an integrated circuit or "IC") having higher performance (e.g., faster speed).

One method of LTP applied to semiconductor manufacturing involves using a short-pulsed laser to thermally anneal the source and drain of the transistor and to activate the implanted dopants therein. Under the appropriate conditions, it is possible to produce source and drain junctions with activated dopant levels that are above the solid solubility limit. This produces transistors with greater speeds and higher drive currents. This technique is disclosed in U.S. Pat. No. 5,908,307 entitled "Fabrication Method for Reduced Dimension FET Devices," incorporated by reference herein.

It is expected that ICs will benefit from the performance improvement demonstrated with performing LTP on single transistors. Unfortunately, scaling LTP from single transistor fabrication to full integrated circuit fabrication is difficult. The LTP process has a very narrow process window (i.e., the range in laser energy that activates the transistor without causing damage is narrow) and requires considerable uniformity, stability and reproducibility in the absolute energy delivered to (and absorbed by) each transistor.

Modern ICs contain a variety of device geometries and materials, and thus different thermal masses. To achieve uniform performance in each transistor, it is necessary that all transistors be heated (annealed) to essentially the same temperature. This places constraints on the permissible range of laser energy delivered to each transistor in the circuit. As a result, two problems arise. The first is that it is difficult to achieve sufficiently uniform exposures (both spatially and temporally) to accomplish uniform heating. The second is that different device geometries require different amounts of incident laser energy because their different thermal masses will affect the local temperature in the doped regions (junctions).

Of these two problems, the more daunting is the effect of local transistor density. Most modern integrated circuits have a variety of transistor densities across the circuit. This variation has two effects on the LTP process. The first is that the local reflectivity varies spatially, thereby changing the amount of heat locally absorbed even with uniform illumination. The second is that the local thermal mass varies spatially. A larger thermal mass requires greater absorbed laser energy to reach the required annealing temperature. As a result, a change in the local thermal mass requires a change in the amount of laser energy absorbed that is required to produce proper annealing. Even with perfectly uniform illumination, there can be significant temperature variations between different transistors on a single IC, or between ICs. This leads to undesirable variations in transistor performance across a single IC and across a product line.

In principle, it may be possible to compensate for the location of higher transistor density across the device by providing a tailored exposure having increased laser fluence in the higher density regions. However, this would require knowing the precise circuit layout across the device for each device to be processed, and would also require precise tailoring of the spatial irradiance distribution of the exposure to match the circuit layer. This endeavor, if it could be accomplished at all, would involve complex apparatus and significant expense.

SUMMARY OF THE INVENTION

The present invention relates to laser thermal processing, and in particular to a method of and apparatus for precisely controlling the maximum temperature of a workpiece to be processed using a short pulse of radiant energy.

The present invention solves the problem of non-uniform thermal heating of a workpiece processed using radiation by introducing a thermally-induced phase "switch" that controls the amount of heat transferred to a workpiece, such as a silicon wafer. This phase switch layer comprises one or more layers of material designed such that the switch changes phase and absorbs extra energy as one or more underlying process regions of the workpiece reach a predetermined temperature. This predetermined temperature may be, for example, the temperature at which the process region is activated. For example, the one or more underlying regions may be the source and drain regions of a transistor or a doped region of a junction, and the predetermined temperature may be the activation temperature of this region. The portions of the phase switch layer overlying the process regions change phase when a critical switch temperature is achieved. By changing phase, the phase switch layer can absorb heat without changing temperature. This limits further increases in the temperature of the underlying process regions to a maximum value.

When the present invention is applied to semiconductor manufacturing and to forming IC devices having transistors, the pre-determined temperature is that where amorphous silicon in the source-drain regions of the transistors reach a temperature between 1100 and 1410° C. In this temperature range, the amorphous silicon melts and the dopants become activated. These temperatures are low enough so that the underlying crystalline silicon substrate does not melt, which is desirable from the viewpoint of device performance. The phase switch of the present invention prevents local regions on the wafer from going substantially beyond the predetermined temperature. This eliminates a variety of undesirable effects from occurring, that might otherwise occur from fluctuations in the magnitude or shape of the radiant energy pulse, or lack of spatial irradiance uniformity of the radiation beam, or place-to-place thermal mass variations due to differing transistor densities.

DETAILED DESCRIPTION OF THE INVENTION

The present invention relates to laser thermal processing, and in particular to a method of and apparatus for precisely controlling the maximum temperature of a workpiece to be processed using a short pulse of radiant energy.

Figure 1:
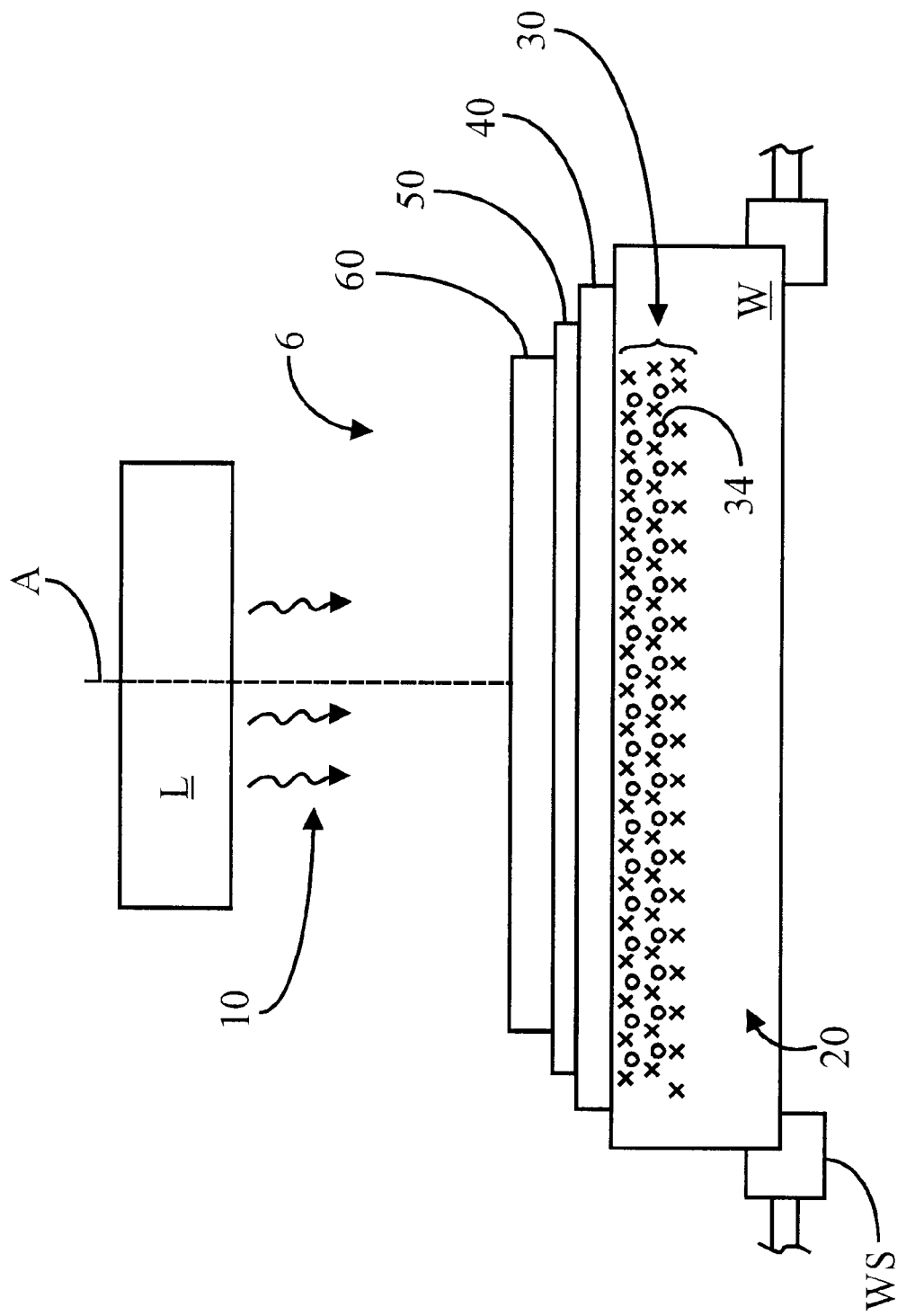
FIG. 1 is a schematic cross-sectional diagram of the phase switch of the present invention shown as part of a film stack arranged on a semiconductor wafer having an amorphous doped region, with the wafer is arranged in a wafer holder in relation to a radiation source.
Figure 2:
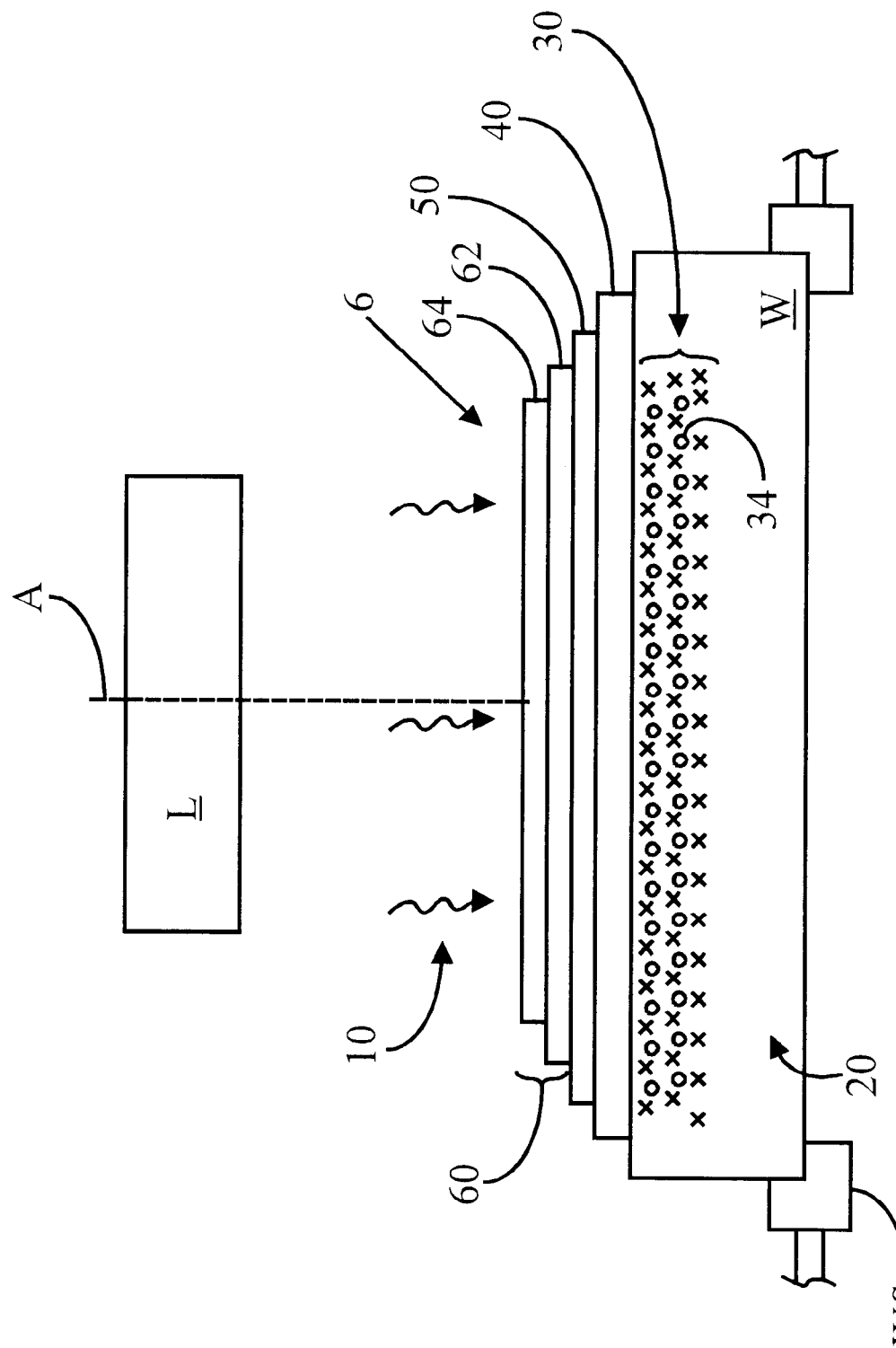
FIG. 2 is the same as FIG. 1, but the phase switch layer of the film stack comprises a layer of silicon dioxide adjacent the absorber layer, and amorphous or polycrystalline silicon adjacent the silicon dioxide layer.
Figure 3:
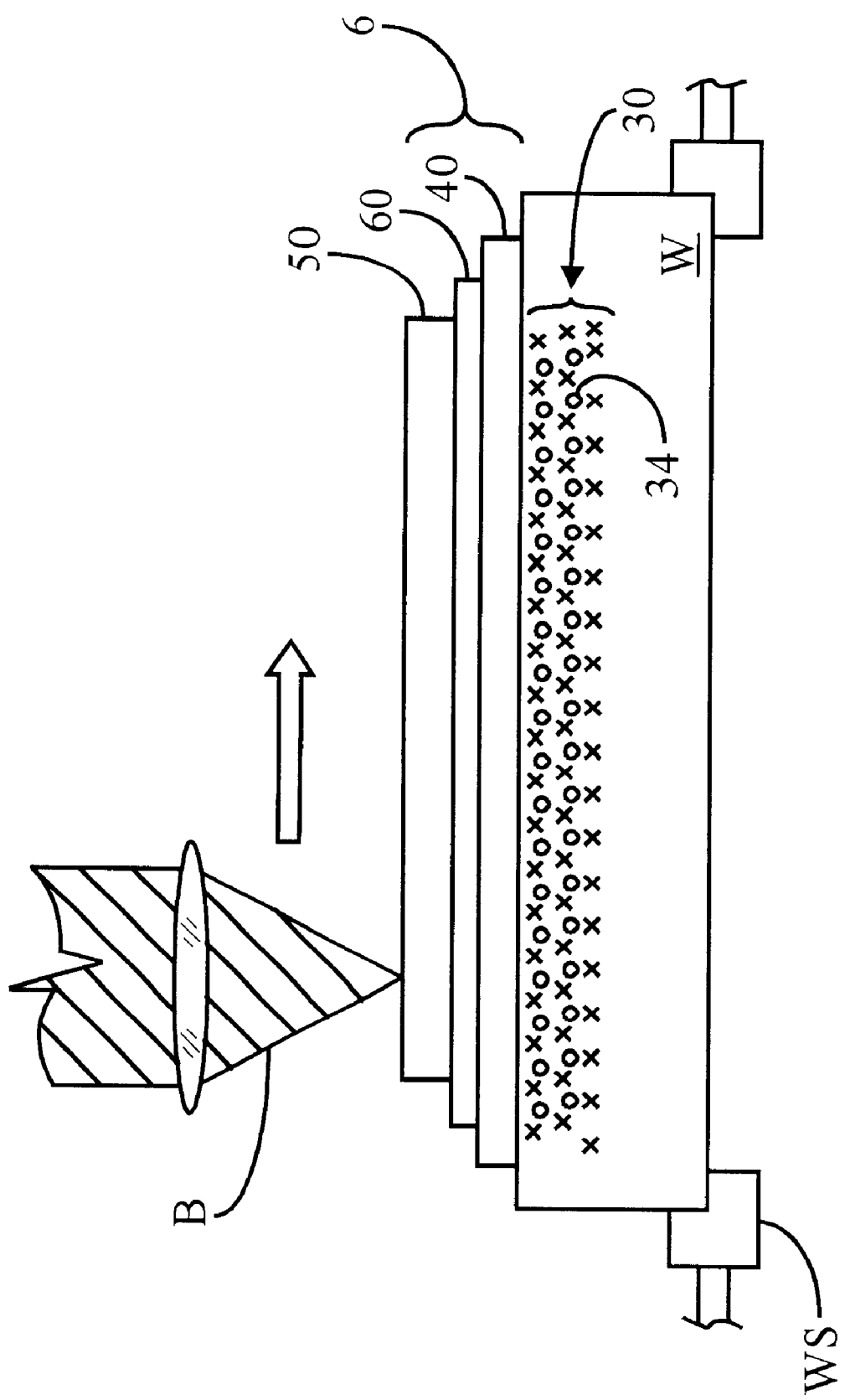
FIG. 3 is the same as FIG. 1, but the phase switch layer is located between the absorber layer and the optional layer to facilitate stripping and the radiant energy source is a narrowly focused beam of radiation, which is scanned across the wafer to produce a short temporal pulse of energy at any point (or line) on the substrate.

The basic concept of the phase switch is illustrated in FIGS. 1–3 with regard to processing a semiconductor substrate (workpiece) as part of the process of manufacturing a semiconductor device such as a junction or a transistor. In FIG. 1, there is shown a film stack 6 formed on a silicon semiconductor wafer W as a workpiece to be processed using radiant energy (photons, electrons, ions, neutral atoms, etc,) 10 from a pulsed radiation source L. Wafer W is supported by a wafer support member WS such that radiation source L, film stack 6 and wafer W all lie along an axis A, as shown in FIG. 1. Radiation 10 may be pulses of laser light having a wavelength of between 300 nm and 1100 nm. A suitable laser light source for radiation source L includes a YAG laser operating at 1064 nm, a frequency-doubled YAG laser operating at 532 nm, and an Alexandrite laser operating between 700 and 800 nm. Suitable radiation pulse lengths range from 1 nanosecond to 1 microsecond, and suitable energy levels range from 0.1–10 $J/cm^2$.

Wafer W comprises a crystalline silicon region 20 within which is formed an amorphous doped silicon region 30 having dopants 34. For the sake of explanation, amorphous doped region 30 is considered as a single doped region. However, amorphous doped region 30 represents one example of a region to be processed, referred to herein as a "process region." For example, wafer W may contain a plurality of amorphous doped regions 30, or one positively doped region and one negatively doped region serving as source and drain regions, respectively, of a transistor. Wafer W has a maximum allowable temperate, which can be its melting temperature $T_M$, or another temperature, such as a temperature beyond which devices on the wafer cease to function, or beyond which unwanted diffusion of doped regions occurs.

With continuing reference to FIG. 1, amorphous doped region 30 may be formed by performing an ion implant of Si or Ge ions into wafer W to a target depth ranging from a few angstroms to about 1000 angstroms. This implantation process disorders the substrate crystal structure in crystal region 20 to the point of making this implanted region amorphous. The implanted species can be Si, Ge, Ar, As, P, Xe, Sb, and In. Implantation of amorphizing dopants can be performed with known apparatus, such as the 9500 XR ION IMPLANTER™, commercially available from Applied Materials, Inc., Santa Clara, Calif.

A second dopant ion implant is then performed using p-type dopant ions (e.g., boron, aluminum, gallium, beryllium, magnesium, or zinc) or n-type dopant ions (e.g., phosphorous, arsenic, antimony, bismuth, selenium, and tellurium) from an ion implanter. The ions are accelerated to a given energy level (e.g., 200 eV to 40 KeV) and implanted in the previously amorphized region to a given dose (e.g., about $1 \times 10^{14}$ atoms/$cm^2$ to $1 \times 10^{16}$ atoms/$cm^2$), thereby forming doped, amorphous region 30. The latter typically has, in practice, a concentration of dopant that is graded with depth into wafer W. The first and second steps of the present embodiment can be interchanged to achieve the same effect, or carried out in a single step if the dopant implant also amorphizes crystalline region 20.

Deposited atop amorphous silicon region 30 is an absorber layer 50 comprising a material capable of absorbing incident radiation and converting the absorbed radiation into heat. Absorber layer 50 needs to be capable of withstanding high temperatures, i.e., temperatures in excess of the crystalline silicon melting temperature of 1410° C. The material making up absorber layer 50 must also be easily removable without impacting the layers or regions below. One role of absorber layer 50 is to maintain the physical structure of devices resident in or on wafer W during processing. An exemplary material for the absorber layer 50 is tantalum (Ta), deposited to a thickness of between 100 and 5000 angstroms via sputtering or by CVD. Other preferred materials for absorber layer 50 include titanium (Ti), titanium nitride (TiN), tantalum nitride (TaN), tungsten nitride (WN), silicon dioxide, silicon nitride, or a combination of these. A silicon dioxide or silicon nitride layer may need to be deposited as part of the absorber layer to prevent contamination of wafer W by the absorber layer material (i.e., between metal and semiconductor), or to provide a temperature drop between the absorber layer and the wafer surface.

A thin strippable layer 40 is optionally placed between absorber layer 50 and amorphous silicon region 30 to facilitate stripping of the absorber layer after LTP is performed. Exemplary materials for the stripping layer 40 include silicon dioxide and silicon nitride, which can be deposited by sputtering or by CVD.

Further included in film stack 6 is a phase switch layer 60 formed atop absorber layer 50. The properties of layer 60 are such that its phase changes at a phase transition temperature $T_P$, from a first phase (e.g. solid) to a second phase (e.g., liquid or vapor), at which point a large amount of heat is absorbed without significantly further increasing the temperature of phase switch layer 60.

Phase switch layer 60 can comprise a single film layer or multiple film layers (i.e., one or more film layers). With reference to FIG. 2, in one embodiment, phase switch layer 60 comprises a first thermal insulating layer 62 and a second phase transition layer 64 formed atop the first thermal insulating layer. Preferred materials for thermal insulating layer 62 include silicon dioxide and silicon nitride, while preferred materials for phase transition layer 64 include polyimide and aluminum arsenide.

In a preferred embodiment of the present invention, layer 60 has a thickness ranging from about 10 nm–20 microns ("μm").

Method of Operation

The present invention operates as follows. With reference to FIGS. 1 and 2, processing of wafer W is performed by directing a pulse of radiation 10 to film stack 6 along an axis A for the purpose of activating amorphous doped region 30. In this example, phase switch layer 60 is initially substantially transparent and is located above absorber layer 50. Accordingly, most of laser radiation 10 passes through layer 60 and is incident absorber layer 50. Radiation 10 is absorbed in layer 50, thereby heating this layer. Absorber layer 50 heats up and consequently heats the amorphous doped region 30 and the phase switch layer 60. Doped amorphous region 30 is thus heated to its activation temperature $T_A$ (which for doped silicon is between 1100–1410° C.), while phase switch layer 60 is also heated to its phase transition temperature $T_P$. At the activation temperature $T_A$ (or in the activation temperature range), dopants 34 become incorporated into the lattice sites and are "activated." However, if too much laser radiation is incident absorber layer 50 then, without phase switch layer 60, amorphous region 30 is heated until it melts. In this regard, the present invention prevents the workpiece (wafer W) from reaching or exceeding the maximum allowable workpiece (wafer) temperature, as mentioned above. A temperature at or above an upper temperature of the maximum allowable workpiece (wafer) temperature will have an undesirable affect on the workpiece (e.g., melting). Melting is undesirable because it can adversely affect the properties of amorphous doped region 30, where the latter constitutes the source or drain region of a transistor. Melting can also damage the transistor gate region (not shown).

With reference now to 6, a narrow beam B (see FIG. 3) of radiation is scanned across workpiece W to create a short pulse of radiation at any point (or line) on the substrate. Beam B can thus be focused down to form a point, line or narrow area of radiation suitable for a scanning beam. In FIG. 3, absorber layer 50 is at the top of film stack 6 and phase change layer 60 is sandwiched between the absorber and optional layer 40. In this geometry, phase change layer 60 need not be transparent to the radiant energy because it is located below the absorber. In some cases, it may not be necessary to employ absorber layer 50 if phase change layer 60 is sufficiently opaque to the incident radiation in beam B or radiation 10 as in FIGS. 1 and 2. For example, if incident radiation 10 (or beam B) consists of electron, ion or neutral atom particles, then an absorber layer may not be necessary because total absorption is assured in any case. The basic principle remains the same regardless of the position of phase change layer 60. The maximum temperature of phase change layer 60 is limited by the latent heat of the phase change over wide variations of the energy in the incident radiation pulse. The temperature of the phase change also limits the maximum temperature of the workpiece.

Figure 4:
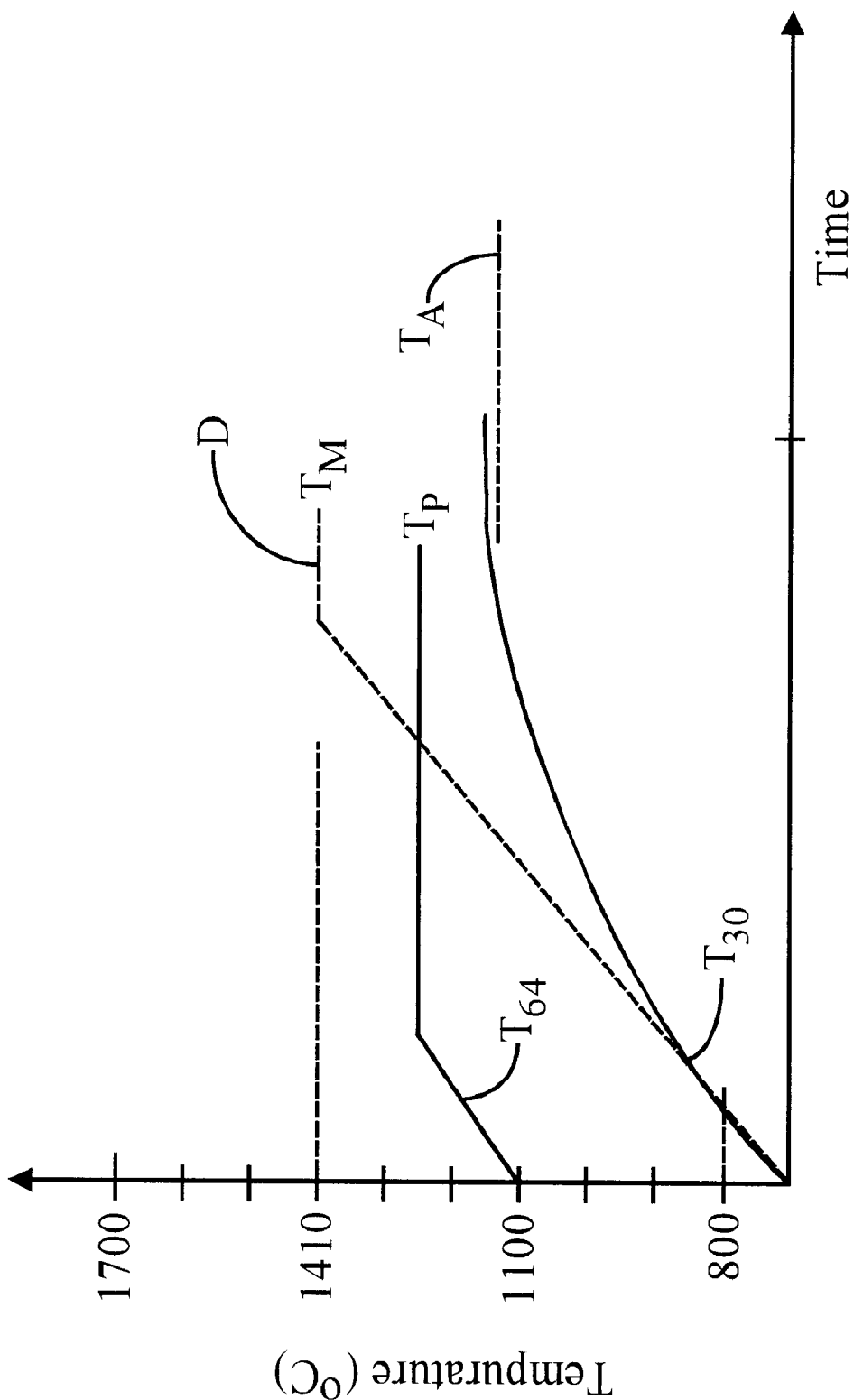
FIG. 4 is a plot of the temperature T vs. time for the temperature ($T_{64}$) of the phase transition layer of the phase switch layer, and the temperature ($T_{30}$) of the amorphous doped region versus time, showing the phase transition temperature $T_P$ where the phase of the switch layer transitions from a first phase to a second phase at or near the activation temperature ($T_A$) where the process region becomes activated.

FIG. 4 illustrates the temperature $T_{30}$ of amorphous doped region 30 during the annealing process as described above. Temperature $T_{30}$ rises as a function of time during exposure to the radiant energy. Unconstrained, the temperature $T_{30}$ would rise to the melting point $T_M$=1410° C. for crystalline silicon, as illustrated with a dotted line D. However, with phase switch layer 60 present (see FIG. 2), the temperature $T_{64}$ of phase transition layer 64 rises along with temperature $T_{30}$ of region 30. Accordingly, phase transition layer 64 can be designed to have a temperature that is greater than or less than temperature $T_{30}$ by adjusting the thickness and thermal characteristics of layer 62 and/or layer 40. FIG. 4 illustrates the case where the temperature $T_{64}$ of phase transition layer 64 is greater than that of temperature $T_{30}$ of process region 30 because the thermal conductivity of layer 62 is greater than that of layer 40.

Where the phase switch layer comprises two layers 62 and 64 as discussed above, adjusting the phase transition temperature $T_P$ may involve adjusting the thickness of layer 62 in the manner described in detail below. When phase transition layer 64 reaches its phase transition temperature $T_P$, this layer absorbs energy without heating, as illustrated by the abrupt flattening of the $T_{64}$ curve of FIG. 4. For the case where phase transition layer 64 is made of polyimide, the transition from the solid phase (i.e., the first phase) to vapor phase (i.e., the second phase) occurs at $T_P$=1480° C. Thus, the timing, or tracking, of the temperature $T_{64}$ of layer 64 relative to the temperature $T_{30}$ of layer 30 is accomplished by adjusting the thermal conductivity and thickness of layer 62 and layer 40. Properly designed, phase switch layer 60 can absorb enough energy to prevent process region 30 from exceeding a predetermined temperature (e.g., melt temperature $T_M$).

Design of Phase Switch Layer

Phase switch layer 60 is designed as follows: The process begins by choosing the operational radiation type and pulse-length to be used. For example, for certain semiconductor manufacturing applications, one may select optical radiation of wavelength of 532 nm and a pulse-length of 20 nanoseconds (ns). The next step is choosing the types of optional strippable layer 40, if desired, and absorber layer 50. Typically, strippable layer 40 can be 10–20 nm of silicon dioxide or silicon nitride, and absorber layer 50 can be 10–500 nm of titanium, titanium-nitride, tantalum, tantalum nitride, tungsten (W) or a combination of these layers. The purpose of absorber layer 50 is to absorb incident laser radiation 10, so sufficient material must be used to absorb greater than about 75% of the incident radiation. For this example, a 10 nm oxide thickness for layer 40 and 40 nm tantalum thickness for layer 50 is a suitable choice.

Next, an arbitrary thickness for layer 62 is chosen. Appropriate materials are either silicon dioxide or silicon nitride. For the present example, 40 nm of silicon dioxide is a suitable choice. Finally, a thickness of 100 nm for layer 64 is chosen. Appropriate materials for phase transition layer 64 are any materials that exhibit a large latent heat associated with the phase transition and have a phase transition temperature $T_P$ in the range between about 1000–3000° C., such as polyimide or aluminum arsenide. A phase transition layer 64 comprising 100 nm of polyimide is a suitable choice for the present example. The thickness of the phase change layer 64 can be adjusted to minimize reflection of the incident radiant energy pulse, i.e., serve as an antireflective coating.

A thermal transport code, such as TOPAZ from Lawrence Livermore National Laboratory, Livermore, Calif., can be used to calculate the thermal behavior of film stack 6 and the underlying layer 30 during a radiation pulse. In particular, the temperature of layer 64 relative to region (layer) 30 is calculated and plotted. The thickness of layers 62 and 40 are then varied until layer 64 reaches its phase transition temperature $T_P$ at the same time when region 30 reaches its activation temperature $T_A$ (or falls within the activation temperature range). This insures that layer 64 will begin to absorb additional heat without a further increase in temperature after region 30 has been activated. In the case where layer 64 comprises polyimide, this absorbed energy goes into vaporizing the polyimide. In the above example, the optimum stack is calculated for an incident wavelength of 532 nm and pulse length of 20 ns:

Layer 40: silicon dioxide: 10 nm
Layer 50 tantalum: 40 nm
Layer 62: silicon dioxide: 0 nm
Layer 64: polyimide: 100 nm With this stack of materials, the phase transition temperature $T_P$ is about 1480° C., which is reached when region 30 achieves an activation temperature $T_A$ of about 1410° C.

Accordingly, phase switch layer 60 is designed so that phase transition layer 64 reaches its phase transition temperature $T_P$ at or before amorphous doped region 30 reaches the melt temperature $T_M$ of about 1410° C., but after it reaches the activation temperature of $T_A=1100°$ C. This is achieved by properly designing thermal insulating layers 62 and 40, as described above. When phase transition layer 64 transitions from the first state to the second state, heat from incident laser radiation 10 is absorbed without an additional temperature rise in layer 64. This inhibits further temperature increases in absorber layer 50 and therefore, further temperature increases in amorphous doped region 30. Generally speaking, phase switch layer 60 is designed to change its phase so as to allow activation of process region 30 without melting the surrounding region (e.g., crystalline region 20).

Note also that for a phase switch layer 60 comprising multiple layers, only one of the layers may be the layer that changes phase (i.e., the "phase transition layer"), while the other layers are "temperature-adjusting layers" that are used to set the phase transition temperature of the transition layer. For the two-layer example of phase switch layer 60 comprising layers 62 and 64, layer 64 is the phase switch layer, while thermal insulating layer 62 is the temperature-adjusting layer.

Figure 5:
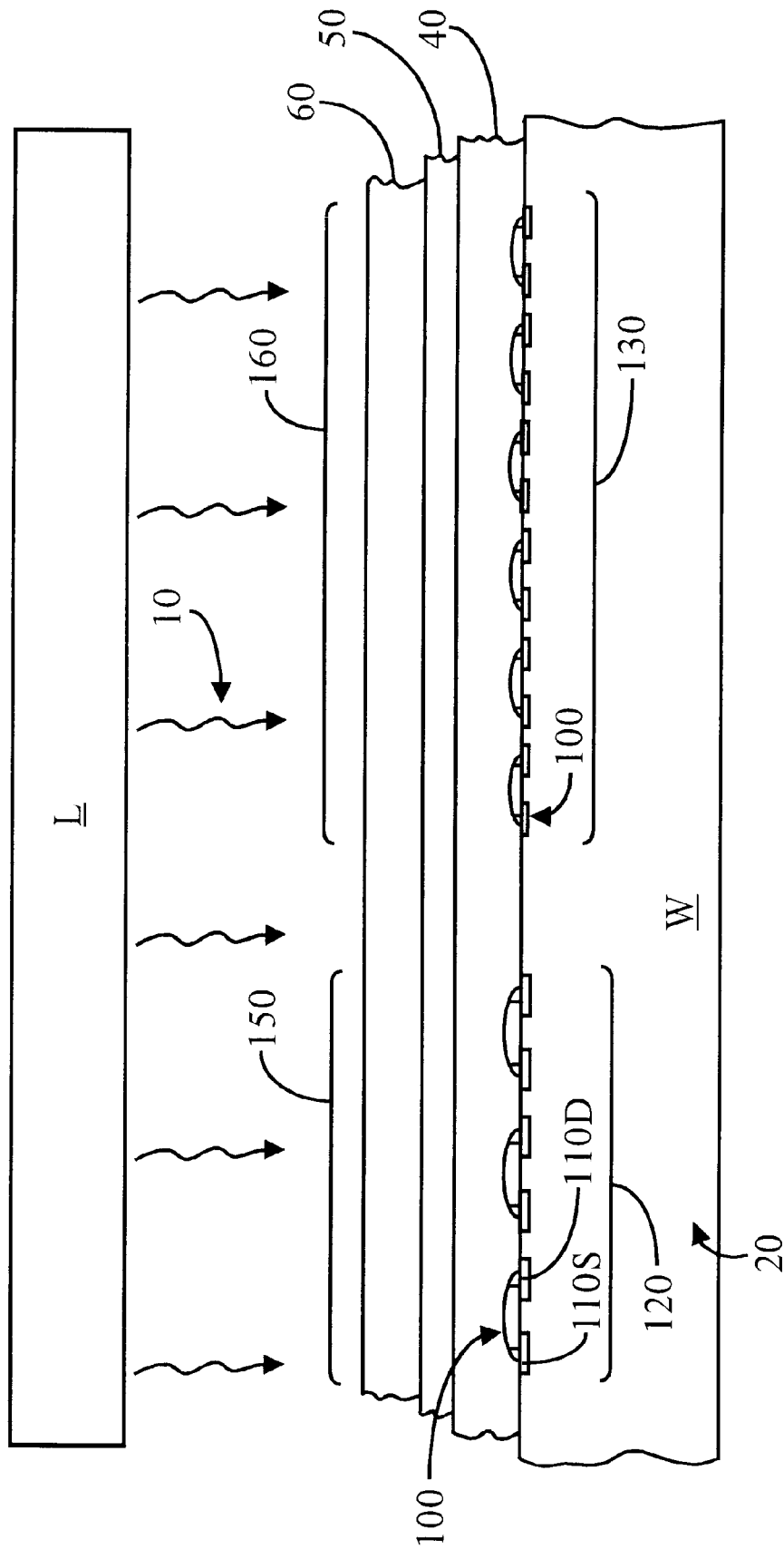
FIG. 5 is a cross-sectional schematic diagram of a wafer having devices (e.g., transistors) in a region of high device density and a region of low device density, with the film stack of FIG. 1 arranged thereon.

With reference now to FIG. 5, non-uniformities in radiation 10 or variations in the density of devices 100 across wafer W influence the temperature of amorphous doped regions 30, which in FIG. 5, are sources and drains 110S and 110D in devices 100. These variations will influence the temperature of phase switch layer 60. As a result, phase switch layer 60 will only activate, i.e. begin to change phase, when source and drain regions 110S and 110D reach the dopant activation temperature range of 1100–1410° C.

The density of devices 100 in region 120 is less than that of region 130, so that region 120 has a smaller thermal mass as compared to region 130. Accordingly, devices 100 in region 120 will be heated more quickly than the devices in region 130 if the incident radiation is uniform. As a result, when irradiated with radiation 10, devices 100 in region 120 will reach their activation temperature before the devices in region 130. Thus, portion 150 of phase switch layer 60 lying above region 120 will transition from a first phase to a second phase and absorb incident radiation 10 without heating. Meanwhile, devices 100 in region 130 take longer to reach the activation temperature and continue to absorb heat from absorber layer 50. Accordingly, portion 160 of phase switch layer 60 lying above region 130 remains in the first phase for a longer time and then transitions to second phase when devices 100 in region 130 reach their activation temperature. The same phenomenon occurs where regions 120 and 130 have different reflectivities.

Because of the adaptive properties of phase switch layer 60, it is difficult to over-expose regions (e.g., regions 120 and 130) on wafer W having different thermal masses, or different reflectivities. Accordingly, locations where the local device geometry is such that greater or lesser amounts of laser radiation are required are readily and automatically compensated.

Method of Forming a Semiconductor Device

Based on the above, the present invention includes a method of forming a semiconductor device on a semiconductor wafer. With reference again to FIG. 5, the method includes the steps of forming one or more process regions in a semiconductor wafer W comprising devices 100 having amorphous doped silicon regions, such as source and drain regions 110S and 110D, respectively, each having an activation temperature. The next steps involve depositing an absorber layer over the process region, depositing a phase switch layer atop or possibly under the absorber layer, and irradiating the absorber layer through the phase switch layer, if it happens to be above the absorber layer, to heat the absorber layer and the phase switch layer. These steps are described above, as is the step of heating the process region with heat from the absorber layer until the phase switch layer reaches the activation temperature. At this point, the phase switch layer switches from a first phase (e.g., solid) to a second phase (e.g. liquid or vapor), while absorbing heat without significantly changing temperature, thereby preventing the increase in temperature of the absorber layer. The final step is then removing the absorber layer and the phase switch layer. This can be accomplished using well known etch techniques.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. An apparatus for controlling the amount of heat delivered to a process region in a workpiece when the workpiece is exposed to radiation, comprising:

an absorber layer formed atop the workpiece and covering the process region, the absorber layer capable of absorbing radiation and converting the radiation to heat;

a phase switch layer formed adjacent the absorber layer and having a phase change temperature, wherein below the phase change temperature the phase switch allows a substantial amount of the radiation to be absorbed by the absorber layer, and at the phase change temperature the phase switch layer undergoes a phase change that allows the phase switch layer to absorb a substantial amount of the radiation and/or heat without a corresponding increase in temperature.

2. The apparatus of claim 1, wherein the process region has an activation temperature, and wherein the phase change temperature corresponds to the activation temperature.

3. The apparatus of claim 1, wherein the process region has an activation temperature, the workpiece has an allowable temperature, and wherein the phase change temperature is between the activation temperature and the workpiece allowable temperature.

4. The apparatus of claim 3, wherein the workpiece allowable temperature is a temperature at which the workpiece melts.

5. The apparatus of claim 1, wherein the phase change temperature is the same as the activation temperature.

6. The apparatus of claim 1, wherein the phase change temperature is less than the activation temperature.

7. The apparatus of claim 1, wherein the phase change temperature is greater than the activation temperature.

8. The apparatus of claim 1, further including a strippable layer between the absorber layer and the workpiece.

9. The apparatus of claim 1, further including a strippable layer between the phase switch layer and the workpiece.

10. The apparatus of claim 1, wherein the process region includes at least one of a source and drain region.

11. The apparatus of claim 1, wherein the process region comprises doped amorphous silicon.

12. The apparatus of claim 1, wherein the absorber layer includes at least one of titanium, tungsten, tantalum, silicon dioxide, silicon nitride, and titanium nitride.

13. The apparatus of claim 1, wherein the phase switch layer includes polyimide.

14. The apparatus of claim 13, wherein the phase switch layer includes a layer of silicon dioxide adjacent the absorber layer.

15. The apparatus of claim 14, wherein the silicon dioxide layer has a thickness between 10 nanometers and 250 nanometers, and the polyimide layer has a thickness between 10 nanometers and 20 microns.

16. The apparatus of claim 1, wherein the phase switch layer includes aluminum arsenide.

17. The apparatus of claim 16, wherein the phase switch layer includes a layer of silicon dioxide adjacent the absorber layer.

18. The apparatus of claim 17, wherein the silicon dioxide layer has a thickness between 10 nanometers and 250 nanometers, and the aluminum arsenide layer has a thickness between 10 nanometers and 20 microns.

19. The apparatus of claim 1, wherein below the phase change temperature the phase switch layer is solid, and at the phase change temperature the phase switch layer starts to melt.

20. The apparatus of claim 1, wherein below the phase change temperature the phase switch layer is solid, and at the phase change temperature the phase switch layer starts to vaporize.

21. The apparatus of claim 1, wherein the phase switch layer is formed above the absorber layer.

22. The apparatus of claim 1, wherein the phase switch layer is formed below the absorber layer.

23. A system comprising:
   a workpiece support member adapted to support a workpiece;
   a radiation source arranged adjacent the workpiece support member and capable of providing a pulsed beam of radiation to the workpiece; and
   the apparatus of claim 1 formed on the workpiece.

24. The system of claim 23, wherein the radiation source is capable of scanning the pulsed beam of radiation across at least a portion of the workpiece.

25. The system of claim 23, wherein the pulsed beam of radiation is focused to a line.

26. The system of claim 23, wherein the pulsed beam of radiation is focused to a point.

27. The system of claim 23, wherein the radiation source includes a laser capable of providing the pulsed beam of radiation at a wavelength between 300 nanometers and 1100 nanometers.

28. A method of controlling the amount of heat transferred to a process region of a workpiece, comprising:
   forming an absorber layer over the process region;
   forming a phase switch layer adjacent the absorber layer, wherein below a phase change temperature the phase switch layer allows a substantial amount of the radiation to be absorbed by the absorber layer, and at the phase change temperature the phase switch layer undergoes a phase change that allows the phase switch layer to absorb a substantial amount of the radiation and/or heat without a corresponding increase in temperature;
   irradiating the absorber layer, thereby heating the process region and the phase switch layer; and
   terminating the heating of the process region by the phase switch layer changing phase at the phase change temperature.

29. The method of claim 28, wherein the process region has an activation temperature, and including terminating the heating of the process region when the process region reaches the activation temperature.

30. The method of claim 28, wherein the phase change temperature is greater than the activation temperature.

31. The method of claim 28, wherein the workpiece has a melting temperature, and including terminating the heating of the process region at a temperature below the workpiece melting temperature.

32. The method of claim 28, wherein irradiating the absorber layer is performed using pulsed radiation.

33. The method of claim 28, wherein irradiating the absorber layer is performed by scanning a line of radiation across the absorber layer.

34. The method of claim 28, including forming the phase switch layer to include at least one of polyimide and aluminum arsenide.

35. The method of claim 34, including forming the phase switch layer to include a thermal insulating layer.

36. The method of claim 35, including forming the thermal insulating layer to include at least one of silicon dioxide and silicon nitride.

37. The method of claim 35, wherein the thermal insulating layer has a thickness, and including adjusting the thickness so that the phase switch layer reaches the phase change temperature when the process region reaches a select temperature.

38. The method of claim 35, wherein the select temperature is an activation temperature of the process region.

39. The method of claim 28, including forming an anti-reflection coating atop the absorber layer.

40. The method of claim 28, including forming the absorber layer from at least one of titanium, tungsten, tantalum, silicon dioxide, silicon nitride, and titanium nitride.

41. The method of claim 28, including forming the phase switch layer atop the absorber layer.

42. The method of claim 28, including forming the phase switch layer beneath the absorber layer.

43. A method, comprising:
   forming a process region in a semiconductor wafer, the process region comprising amorphous doped silicon and having an activation temperature;
   forming an absorber layer adjacent the semiconductor wafer and over the process region;
   forming a phase switch layer adjacent the absorber layer, wherein below a phase change temperature the phase switch layer allows a substantial amount of the radiation to be absorbed by the absorber layer, and at the phase change temperature the phase switch layer undergoes a phase change that allows the phase switch layer to absorb a substantial amount of the radiation and/or heat without a corresponding increase in temperature;
   irradiating the absorber layer, thereby heating the process region and the phase switch layer;
   terminating the heating of the process region by the phase switch layer changing phase at the phase change temperature; and
   removing the absorber layer and phase switch layer.

44. The method of claim 43, including forming the phase switch layer to include a thermal insulating layer and a phase transition layer.

45. The method of claim 44, including forming the thermal insulating layer from two or more layers.

46. The method of claim 44, including forming the phase transition layer from at least one of polyimide and aluminum arsenide.

47. The method of claim 43, including forming the phase switch layer atop the absorber layer.

48. The method of claim 43, including forming the phase switch layer beneath the absorber layer.

* * * * *